United States Patent
Murakami et al.

(10) Patent No.: US 7,447,022 B2
(45) Date of Patent: Nov. 4, 2008

(54) RACK-MOUNT EQUIPMENT BAY COOLING HEAT EXCHANGER

(75) Inventors: Vance Murakami, Cupertino, CA (US); Christian L. Belady, Richardson, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 111 days.

(21) Appl. No.: 11/501,657

(22) Filed: Aug. 9, 2006

(65) Prior Publication Data

US 2008/0037217 A1   Feb. 14, 2008

(51) Int. Cl.
*H05K 7/20* (2006.01)
*H01L 23/36* (2006.01)

(52) U.S. Cl. ............... 361/695; 361/694; 361/696; 361/724; 165/104.34; 454/184

(58) Field of Classification Search ......... 361/676–679, 361/686–697, 717–727; 62/178, 177, 259.2, 62/414, 418, 419, 186; 165/80.3, 80.4, 185, 165/903, 104.19, 104.33, 104.34, 121–126; 312/223.2, 223.3; 454/184; 174/15.1, 16.1, 174/50, 50.1; 29/592.1, 729, 830, 832, 854
See application file for complete search history.

(56) References Cited

U.S. PATENT DOCUMENTS

| | | | |
|---|---|---|---|
| 3,749,981 A * | 7/1973 | Koltuniak et al. ........... 361/696 |
| 4,514,746 A | 4/1985 | Lundqvist | |
| 5,069,041 A | 12/1991 | Thielman et al. | |
| 5,414,591 A * | 5/1995 | Kimura et al. ............... 361/695 |
| 5,570,740 A * | 11/1996 | Flores et al. ........... 165/104.34 |
| 5,718,628 A * | 2/1998 | Nakazato et al. ............. 454/184 |
| 6,034,873 A * | 3/2000 | St.ang.hl et al. .............. 361/701 |
| 6,205,796 B1 * | 3/2001 | Chu et al. ........................ 62/94 |
| 6,305,180 B1 | 10/2001 | Miler et al. | |
| 6,407,533 B1 * | 6/2002 | Bartek et al. ................. 320/150 |
| 6,516,954 B2 * | 2/2003 | Broome ........................ 211/26 |
| 6,628,520 B2 | 9/2003 | Patel et al. | |
| 6,775,137 B2 * | 8/2004 | Chu et al. .................... 361/696 |
| 6,859,366 B2 | 2/2005 | Fink | |
| 6,957,544 B2 * | 10/2005 | Dobbs et al. ................... 62/178 |
| 6,980,433 B2 | 12/2005 | Fink | |
| 7,046,514 B2 | 5/2006 | Fink et al. | |
| 7,051,946 B2 | 5/2006 | Bash et al. | |
| 7,254,022 B2 * | 8/2007 | Ebermann .................... 361/696 |
| 7,286,345 B2 * | 10/2007 | Casebolt ..................... 361/687 |
| 7,319,594 B2 * | 1/2008 | Nicolai et al. ................ 361/724 |
| 7,365,973 B2 * | 4/2008 | Rasmussen et al. ......... 361/694 |

FOREIGN PATENT DOCUMENTS

JP      409298377 A   * 11/1997
JP      31-224066 A   *  8/1998

* cited by examiner

*Primary Examiner*—Michael V Datskovskiy (57) ABSTRACT

An apparatus in one example comprises at least one heat exchanger mounted within a rack-mount equipment bay and at least one duct coupled with the at least one heat exchanger that is configured to form a semi-closed cooling loop with at least one electronic device mounted within the rack-mount equipment bay. The at least one duct directs an airflow between the at least one heat exchanger and the at least one electronic device for cooling of the at least one electronic device.

22 Claims, 5 Drawing Sheets

RACK-MOUNT EQUIPMENT BAY COOLING HEAT EXCHANGER

BACKGROUND

It is well-known that computers, servers, disk drives and other electronic equipment mounted in equipment racks will generate heat when operated. It is also well-known that if semiconductors within the electronic equipment get too hot, they can fail, thus making it important to keep electronic equipment cool.

One method of cooling rack-mounted electronic equipment is to locate the equipment and the racks that hold the equipment in an enclosed room, where the temperature of the enclosed room is controlled using air conditioning equipment. Once the air in the enclosed room has been cooled, the electronic equipment is cooled using passive or active cooling techniques. Passive techniques for keeping the air adjacent to a hot surface of an electronic device cool rely on convection currents that are created by the hot surfaces of an electronic device. For additional cooling, active cooling techniques such as electric cooling fans and fluid pumps are used to locally dissipate heat within an individual piece of electronic equipment. Electronic equipment often uses intake and/or exhaust fans for local heat dissipation within the electronic equipment. Local dissipation of heat within the electronic equipment is inefficient when multiple pieces of electronic equipment are located within a single equipment rack.

DESCRIPTION OF THE DRAWINGS

Features of example implementations of the invention will become apparent from the description, the claims, and the accompanying drawings in which:

DETAILED DESCRIPTION

Referring to the BACKGROUND section above, the air conditioning equipment is often located outside of the enclosed room. The air conditioning equipment also cools the entire volume of air within the enclosed room. For increased cooling efficiency: 1) the volume of air to be cooled can be reduced; 2) the air conditioning equipment can be located closer to the electronic equipment; and 3) the cool air can be directed to the electronic equipment.

Figure 1:
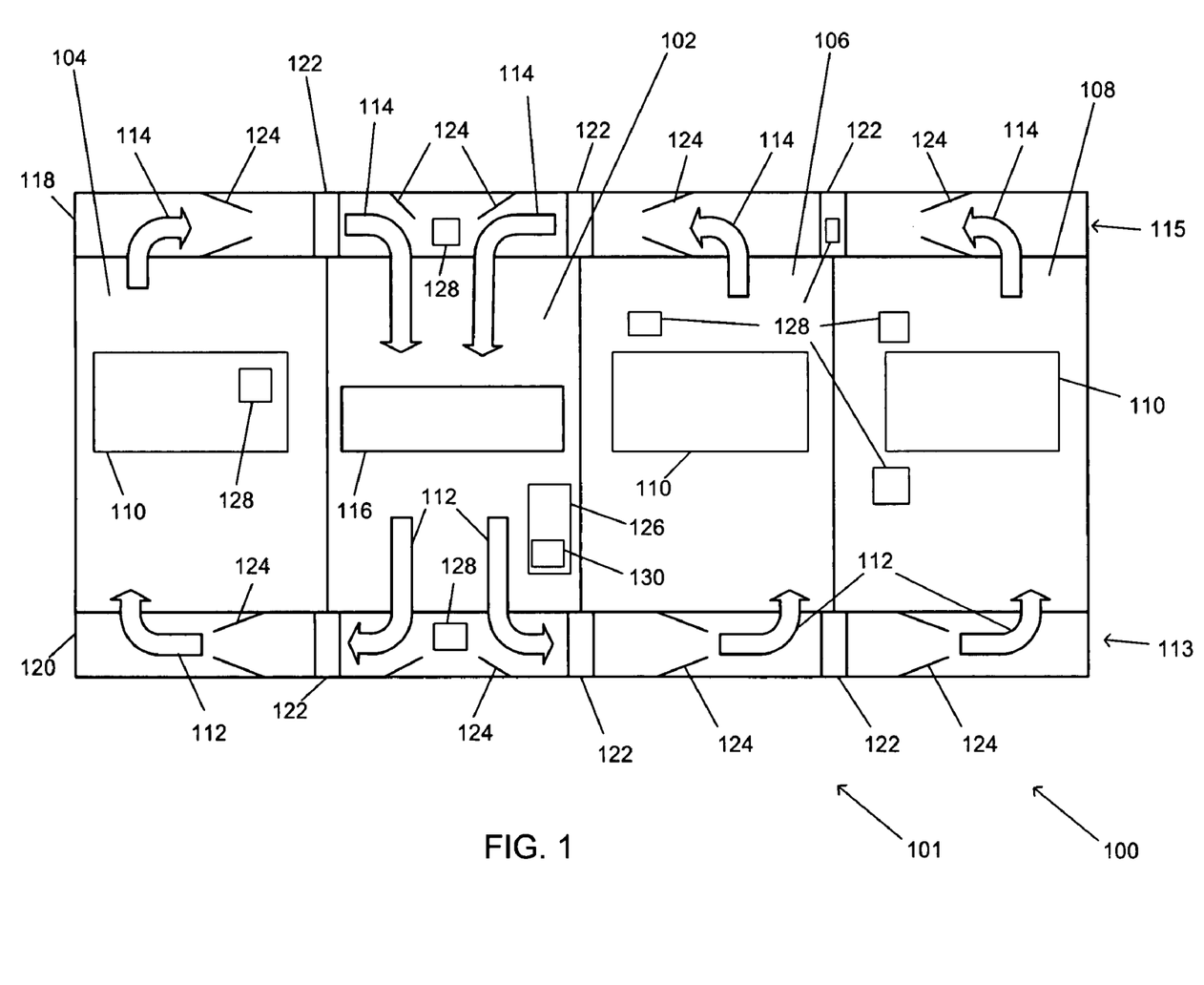
FIG. 1 is a representation of a top view of one implementation of an apparatus that comprises at least one heat exchanger and at least one electronic device.

Turning to FIG. 1, an apparatus 100 in one embodiment comprises a rack-mount equipment bay 101 for electronic devices 110. The equipment bay 101 comprises at least one rack for the electronic devices 110 and at least one heat exchanger 116 for cooling the electronic devices 110. The equipment bay 101 in one example comprises one heat exchanger 116 per electronic device 110. In another example, the equipment bay 101 comprises one heat exchanger for a plurality of electronic devices 110. The heat exchanger 116 and electronic device 110 in one implementation are mounted within the same rack of the equipment bay 101. In another implementation, the heat exchanger 116 and electronic device are mounted within different racks, for example, adjacent racks of the equipment bay 101. The equipment bay 101 in a further example comprises a plurality of racks, for example, at least one cooling rack and at least one equipment rack. Referring to the example of FIG. 1, the equipment bay 101 comprises a cooling rack 102 and equipment racks 104, 106, and 108. In this example, the cooling rack 102 is dedicated for the heat exchanger 116. Examples of the equipment bay 101 comprise one cooling rack per equipment rack, one cooling rack for a plurality of equipment racks, or a plurality of cooling racks and a plurality of equipment racks.

The cooling rack 102 and the equipment racks 104, 106, and 108 in one example are similarly sized such that the cooling rack 102 can be installed within the equipment bay 101 with the equipment racks 104, 106, and 108. For example, the cooling rack 102 is positioned adjacent to the equipment racks 104, 106, and 108 within rack row spacing. The cooling rack 102 and the equipment racks 104, 106, and 108 in a further example conform to an "EIA RS-310" standard (Electronic Industries Alliance, Arlington, Va., http://www.eia.org). For example, the cooling rack 102 and the equipment racks 104, 106, and 108 comprise a height interval that is an integral multiple of "U" (1.75 inches), for example, "1U", "2U", "4U", etc. and a width of approximately 19 or 23 inches, as will be understood by those skilled in the art. Alternate embodiments of the cooling rack 102 and equipment racks 104, 106, and 108 are wider or narrower than 19 inches.

The equipment racks 104, 106, and 108 comprise electronic devices 110, for example, computer servers, data storage, and/or network equipment. During operation, the electronic devices 110 generate thermal energy and dissipates the thermal energy into an airflow through the equipment racks 104, 106, and 108; for example, an intake airflow 112 and an exhaust airflow 114. The electronic devices 110 dissipate the thermal energy into the airflow such that the exhaust airflow 114 is relatively warmer than the intake airflow 112, as will be understood by those skilled in the art.

The cooling rack 102 in one example comprises a dedicated cooling rack within the equipment bay 101. The cooling rack 102 comprises at least one heat exchanger 116 for cooling airflow through the cooling rack 102. The cooling rack 102 draws in the exhaust airflow 114 from the equipment racks 104, 106, and 108. The cooling rack 102 directs the airflow through and/or along the heat exchanger 116. The heat exchanger 116 absorbs the thermal energy and reduces a temperature of the exhaust airflow 114. The cooling rack 102 in one example circulates the exhaust airflow 114 back to the intake airflow 112. In one example, a dedicated cooling rack allows for a larger, centralized, more efficient heat exchanger 116 to be mounted within the cooling rack 102.

The heat exchanger 116 in one example comprises an evaporator coil or portion of a heat pump (not shown), such as a refrigeration system. In another example, the heat exchanger 116 comprises a radiator or heater core with a chilled fluid (e.g., water, water/glycol mixture, or other coolant). For example, the chilled fluid flows through the radiator and absorbs the thermal energy from the airflow. In yet another example, the heat exchanger 116 comprises a Peltier device. The thermal energy absorbed by the heat exchanger 116 is dissipated away from the cooling rack 102 and the equipment racks 104, 106, and 108; for example, outside a room or data center (not shown) that houses the cooling rack 102 and the equipment racks 104, 106, and 108. The thermal energy may be carried away from the equipment bay 101 via heat pipes, air ducts, fluid transfer pipes, or other heat transfer means. The heat exchanger 116 in another example comprises a rack-mountable, standalone cooling component. In this example, the heat exchanger 116 is modular and may be mounted in an equipment rack 104, 106, or 108. In another example, a plurality of heat exchangers 116 may be mounted in a rack.

The apparatus 100 in one embodiment comprises at least one duct for airflow, for example, ducts 118 and 120. The ducts 118 and 120 in one example are coupled with the cooling rack 102 and form a semi-closed cooling loop with the electronic device 110. In a further example, the ducts 118 and 120 are coupled with one or more of the equipment racks 104, 106, and 108. The ducts 118 and 120 in one example are removable to access the electronic devices 110 or the cooling rack 102. The ducts 118 and 120 in one example direct airflow between the cooling rack 102 and the equipment racks 104, 106, and 108 for cooling of the equipment racks 104, 106, and 108. The ducts 118 and 120 in one example are external to the cooling rack 102 and the equipment racks 104, 106, and 108. In a further example, the ducts 118 and 120 are external to the equipment bay 101. In yet another example, the ducts 118 and 120 are coupled with the cooling rack 102 and the equipment racks 104, 106, and 108.

In one example, the duct 118 comprises an exhaust duct 118 and the duct 120 comprises an intake duct 120. The exhaust duct 118 directs the exhaust airflow 114 from the equipment racks 104, 106, and 108 to the cooling rack 102. For example, the exhaust duct 120 captures and directs the exhaust airflow 114 from an exhaust face 115 of the equipment racks 104, 106, and 108 to the cooling rack 102. The intake duct 120 directs the intake airflow 112 to the equipment racks 104, 106, and 108 for cooling the equipment racks 104, 106, and 108. For example, the intake duct 120 directs the intake airflow 112 to an intake face 113 of the equipment racks 104, 106, and 108.

The intake face 113 in one example comprises a front of the equipment racks 104, 106, and 108. In alternative implementations, the intake face 113 of the equipment racks 104, 106, and 108 comprises any of a side, top, bottom, or rear face of the equipment racks 104, 106, and 108 and may be different sides for each equipment rack. For example, the equipment rack 104 may comprise an intake face 113 on a front face and the equipment rack 106 may comprise an intake face 113 on a side face. The exhaust face 115 in one example comprises a rear of the equipment racks 104, 106, and 108. In alternative examples, the exhaust face 115 of the equipment racks 104, 106, and 108 comprises any of a side, top, bottom, or front face of the equipment racks 104, 106, and 108 and may be different sides for each equipment rack. The intake face 113 and exhaust face 115 in a further example comprise intake and/or exhaust ports (not shown). The intake duct 120 in one example is coupled with the intake face 113 and/or intake port. The exhaust duct 118 in one example is coupled with the exhaust face 115 and/or exhaust port. In yet another example, both the intake duct 120 is coupled with the intake face 113, and the exhaust duct 120 is coupled with the exhaust face 115 to form a substantially closed cooling loop with the cooling rack 102.

The exhaust duct 118 and intake duct 120 in one example cooperate to provide a more direct route for the intake airflow 112 to the equipment racks 104, 106, and 108 and for the exhaust airflow 114 to the cooling rack 102. The exhaust duct 118 and intake duct 120 in one example reduce mixing of the intake airflow 112 and exhaust airflow 114 with ambient air. In a further example, the exhaust duct 118 and intake duct 120 reduce mixing of the intake airflow 112 with the exhaust airflow 114.

The ducts 118 and 120 in one example comprise at least one fan 122 for directing the airflow through the ducts 118 and 120. The fans 122 push and/or pull the airflow through the ducts 118 and 120. The fans 122 in one example comprise adjustable fans, for example, a quantity of the airflow (i.e., cubic feet per minute (CFM) of airflow) can be increased or reduced. The fans 122 in one example have adjustable fan blades and/or adjustable rotation speed to increase or reduce the airflow. Examples of the fan 122 comprise a variable frequency drive (VFD) fan, an axial-flow fan, and a centrifugal fan.

The ducts 118 and 120 in one embodiment comprise at least one damper 124. The dampers 124 direct the airflow through the ducts 118 and 120. For example, the dampers 124 create airflow restrictions in the ducts 118 and 120 to control the airflow through the ducts 118 and 120. The dampers 124 in one example are static (e.g., fixed in place). In another example, the dampers 124 are adjustable to provide a variable airflow restriction. In one example, the dampers 124 are manually adjusted by a technician or end user. In another example, the dampers 124 are automatically adjusted, for example, by servos, electromechanical switches, and/or pneumatics.

The apparatus 100 in one embodiment comprises a control component 126. The control component 126 in one example monitors cooling of the equipment racks 104, 106, and 108 by the cooling rack 102. In another example, the control component 126 adjusts the cooling rack 102, the intake duct 120, and/or the exhaust duct 118 to maintain predetermined levels of cooling (e.g., temperature levels) for the equipment racks 104, 106, and 108. The control component 126 in one example increases or reduces an amount of cooling provided by the cooling rack 102. The control component 126 in one example comprises a microprocessor or computer. In a further example, the control component 126 comprises an instance of a recordable data storage medium 130. The recordable data storage medium 130 in one example stores software and/or firmware for execution by the control component 126.

The apparatus 100 in one embodiment comprises at least one sensor 128. The sensors 128 in one example comprise airflow sensors that sense the quantity of airflow. The airflow sensors may be located in the cooling rack 102, the equipment racks 104, 106, and 108, the electronic devices 110, or the air ducts 118 and 120. The sensors 128 in another example comprise temperature sensors (e.g., thermistors) that sense one or more of the temperature of the airflow, a temperature of the electronic devices 110, or a coolant temperature of the heat exchanger 116. The temperature sensors may be located in the cooling rack 102, the equipment racks 104, 106, and 108, the electronic devices 110, or the air ducts 118 and 120. The sensors 128 in another example may sense a revolution rate of the fans 122 (e.g., revolutions per minute, RPMs), a voltage applied to the fans 122, or a current position of the dampers 124 (e.g., closed, thirty degrees open, fully open, etc.). The sensors 128 in one example comprise humidity sensors that sense humidity of the airflow through the cooling rack 102, the equipment racks 104, 106, and 108, the intake duct 118, or exhaust duct 120. In another example, the sensors 128 comprise differential air pressure sensors.

In one embodiment, the heat exchanger 116, ducts 118 and 120, fans 122, dampers 124, and/or sensors 128 are modular. In one example, a first intake duct 120 may be replaced with a larger second intake duct 120. In another example, a first fan 122 that has failed may be replaced with a second fan 122. The ducts 118 and 120, fans 122, dampers 124, and/or sensors 128 in one example are hot swappable and can be replaced while the cooling rack 102 is operational. In one example, one or more of the heat exchanger 116, intake ducts 118, exhaust ducts 120, fans 122, dampers 124, and/or sensors 128 comprise an integral component. For example, an intake duct 118 may comprise a built-in damper 124, adjustable fan 122, and sensor 128.

The control component 126 in one embodiment is located within the cooling rack 102. In another embodiment, the control component 126 is located external to the cooling rack 102 and may be remotely located from the cooling rack 102 and the equipment racks 104, 106, and 108. In a first embodiment, the control component 126 is communicatively coupled with the sensors 128 and monitors the cooling of the electronic devices 110. In a second embodiment, the control component 126 is communicatively coupled with the fans 122 and/or dampers 124 and controls the cooling of the electronic devices 110. In a third embodiment, the control component 126 is communicatively coupled with the fans 122, the dampers 124, and the sensors 128 for monitoring and control of the cooling of the electronic devices 110.

The control component 126 in one embodiment automatically monitors and controls the cooling. For example, the control component 126 dynamically controls the fans 122 and/or dampers 124 to adjust the intake airflow 112 and/or exhaust airflow 114 based on current cooling needs of the electronic devices 110. In another embodiment, the control component 126 employs a user interface (not shown) for displaying information from the sensors 128 (e.g., quantity of airflow, temperatures, etc.) to a technician and receiving inputs from the technician to change the cooling. The control component 126 in one example displays or sends a warning message to the technician, for example, if a sensor 128 reports a temperature above a predetermined threshold, a low revolution rate of a fan 122, low airflow through the duct 118, or a stuck damper 124. In another example, the control component 126 may adjust the fans 122 and/or dampers 124 to reroute airflow around an obstruction or problem area. The control component 126 in one example may partially or completely close off a duct 118 or 120 (e.g., completely close a damper 124 or shut off a fan 122) if an electronic device 110 is turned off. In another example, the control component 126 may turn off an electronic device 110 to prevent damage due to lack of cooling.

Figure 2:
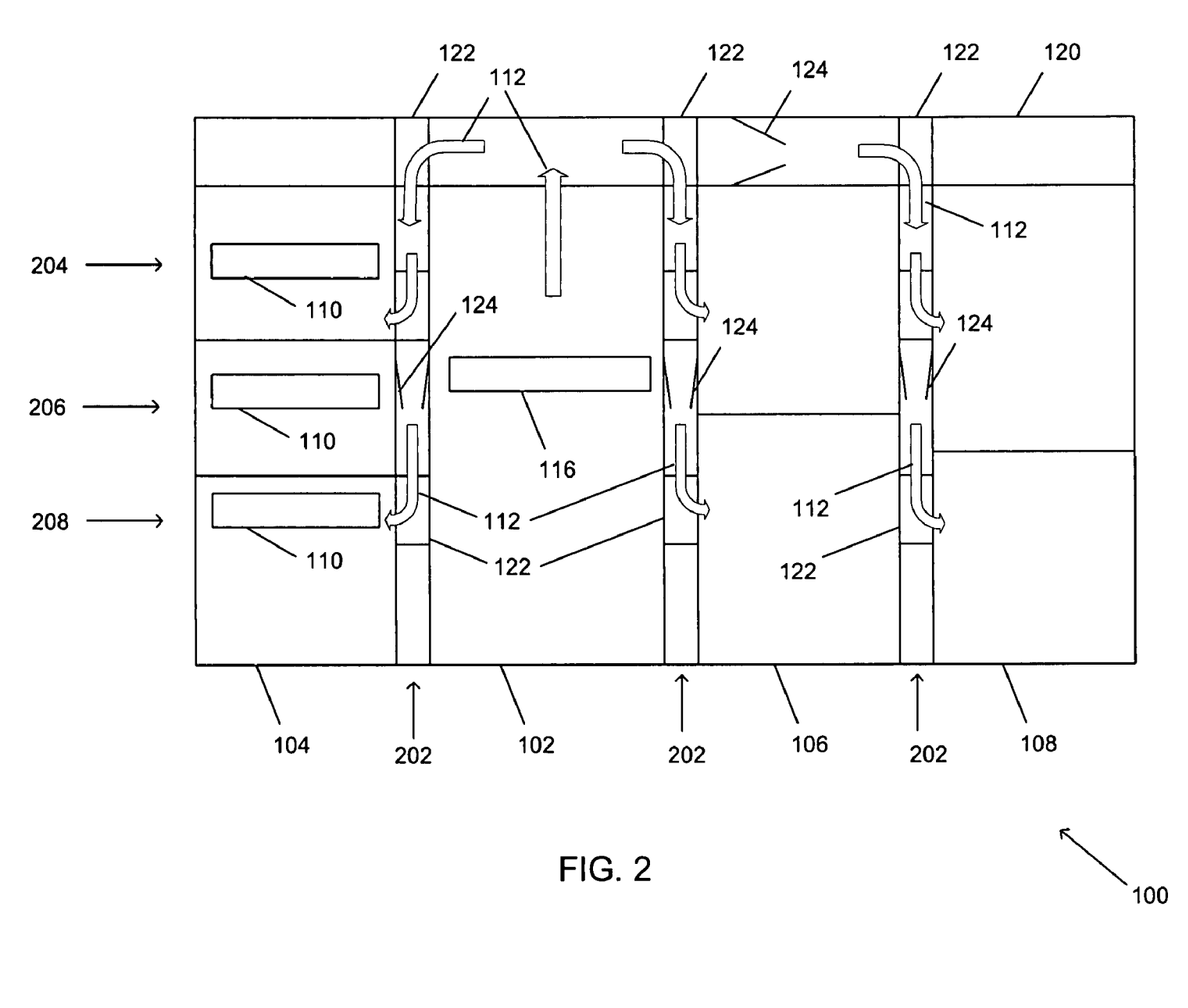
FIG. 2 is a representation of a front view of another implementation of the apparatus of FIG. 1 that comprises a primary delivery duct and at least one vertical duct.

Turning to FIG. 2, in another implementation of the apparatus 100 the exhaust duct 118 and intake duct 120 comprise at least one vertical duct 202. The vertical ducts 202 in one example direct the intake airflow 112 to the equipment racks 104, 106, and 108. In another example, the vertical ducts 202 direct the exhaust airflow 114 to the cooling rack 102. The intake duct 120 and the vertical duct 202 in one example provide a "cold air curtain" to the intake face 113 of the equipment racks 104, 106, and 108.

The equipment racks 104, 106, and 108 in one example comprise a number of equipment shelves 204, 206, and 208 for multiple electronic devices 110. The vertical ducts 202 may comprise fans 122, dampers 124, or sensors 128 to provide variable amounts of the intake airflow 112 to the equipment shelves 204, 206, and 208. The control component 126 in one example adjusts the amount of intake airflow 112 to the equipment shelves 204, 206, and 208. If the electronic device 110 on the equipment shelf 204 has a higher heat output than the electronic device 110 on the equipment shelf 206, the control component 126 diverts a first amount of the intake airflow 112 to the equipment shelf 204 and a second amount of the intake airflow 112 to the equipment shelf 206, where the first amount is greater than the second amount.

Figure 3:
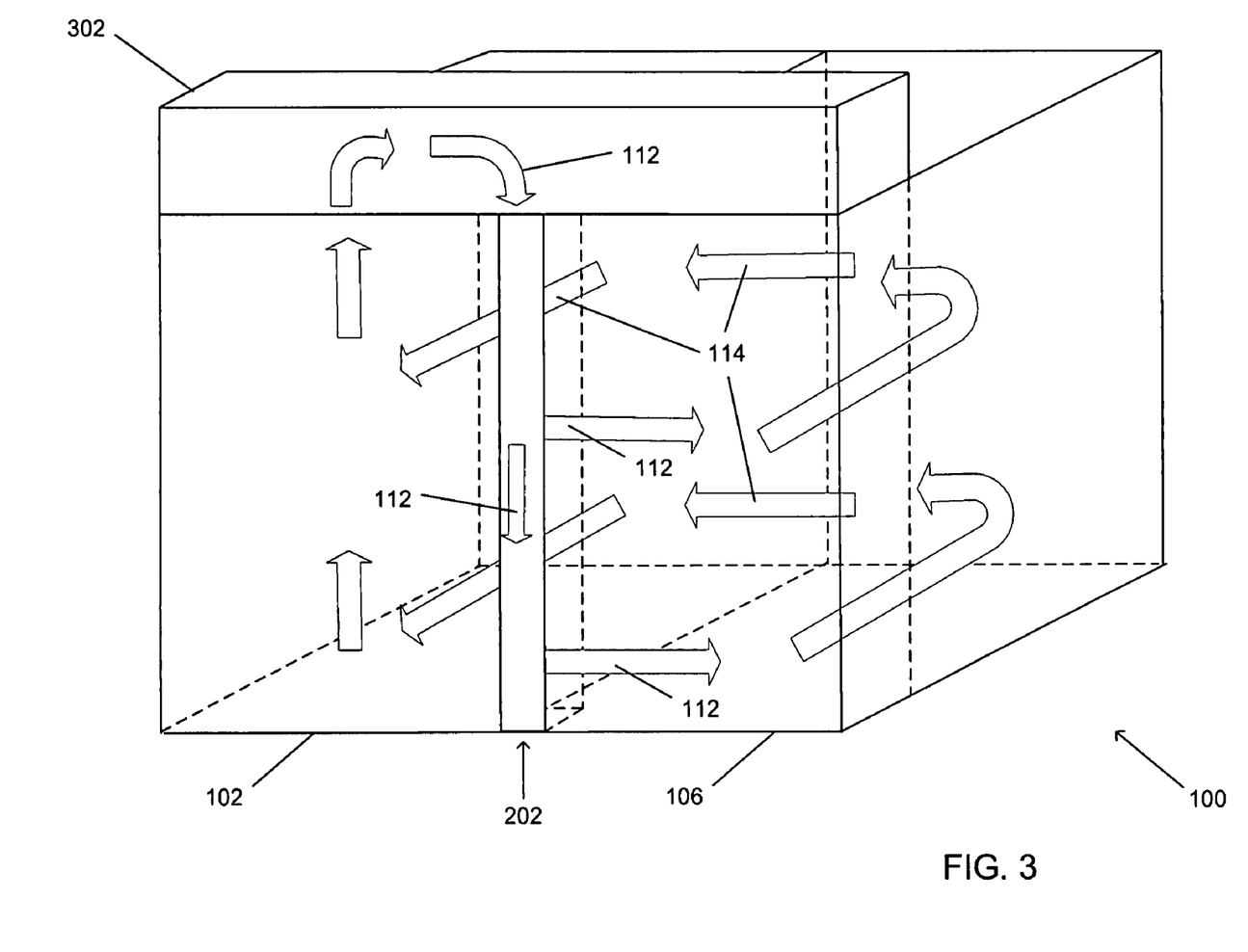
FIG. 3 is a representation of a perspective view of the implementation of FIG. 2 and illustrates intake and exhaust airflow.

Turning to FIG. 3, in yet another implementation of the apparatus 100, the intake duct 120 comprises a primary delivery duct 302. For clarity, equipment racks 106 and 108 are omitted from FIG. 3. The primary delivery duct 302 in one example is located along a top and front of the cooling rack 102 and the equipment racks 104, 106, and 108. The cooling rack 102 directs the intake airflow 112 up into the primary delivery duct 302. The primary delivery duct 302 directs the intake airflow 112 substantially horizontally toward the equipment racks 104, 106, and 108. The vertical ducts 202 are coupled with the primary delivery duct 302 and direct the intake airflow 112 substantially vertically (e.g., down) toward the equipment racks 104, 106, and 108. For example, intake airflow 112 from the primary delivery duct 302 is directed down into the vertical ducts down 202 for delivery to the front of the equipment racks 104, 106, and 108. The equipment racks 104, 106, and 108 draw in the intake airflow 112 and send the exhaust airflow 114 toward a back of the cooling rack 102 and equipment racks 104, 106, and 108. The cooling rack 102 draws the exhaust airflow 114 in and through the heat exchanger 116.

Figure 4:
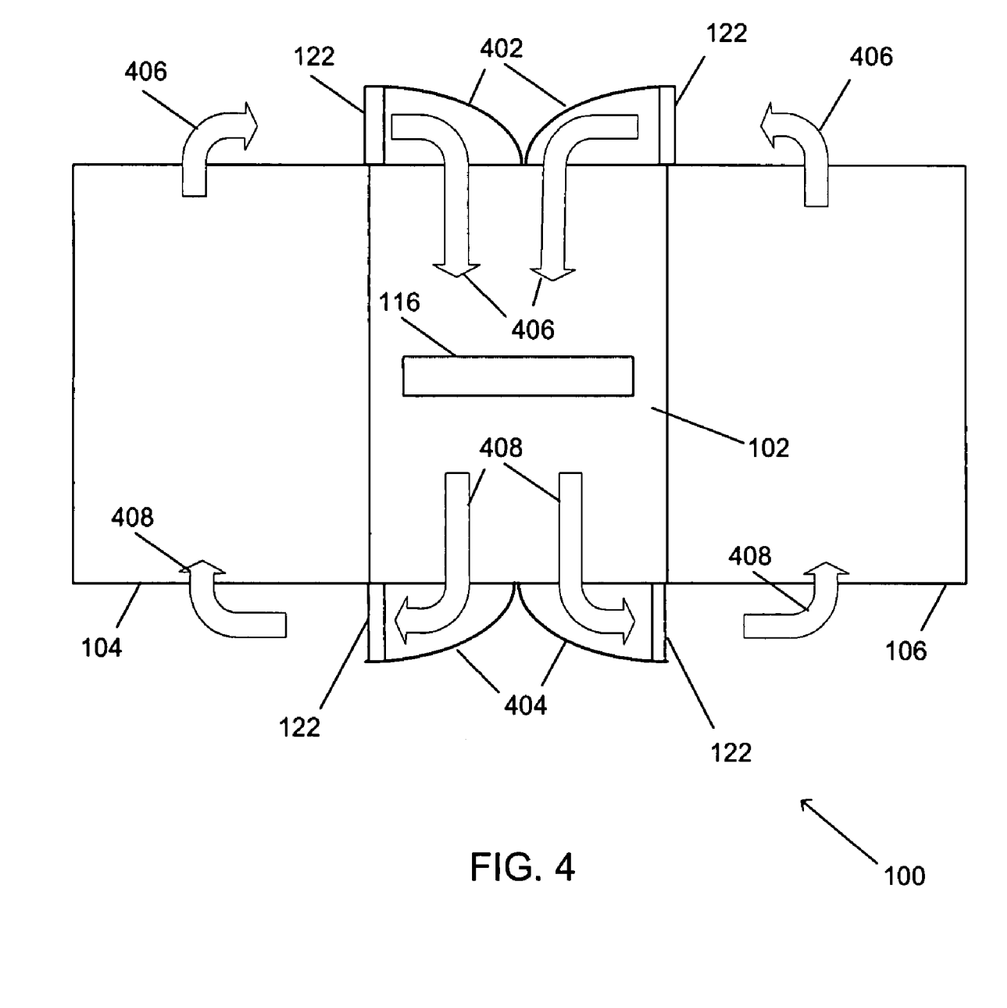
FIG. 4 is a representation of a top view of yet another implementation of the apparatus of FIG. 1 that comprises intake and exhaust ducts.

Turning to FIG. 4, in one implementation of the apparatus 100, an exhaust duct 402 and intake duct 404 provide a semi-closed circulation loop of exhaust airflow 406 and intake airflow 408. In the implementation of FIG. 4, equipment rack 108 is not shown for clarity. This implementation allows for some mixing of cooled intake airflow 408 with ambient air around the apparatus 100. The exhaust duct 402 in one example draws air from adjacent equipment racks 104 and 106. The intake duct 408 in one example directs the intake airflow 408 towards the front face of the adjacent equipment racks 104 and 106 to provide a cold air curtain to the equipment racks 104 and 106.

Figure 5:
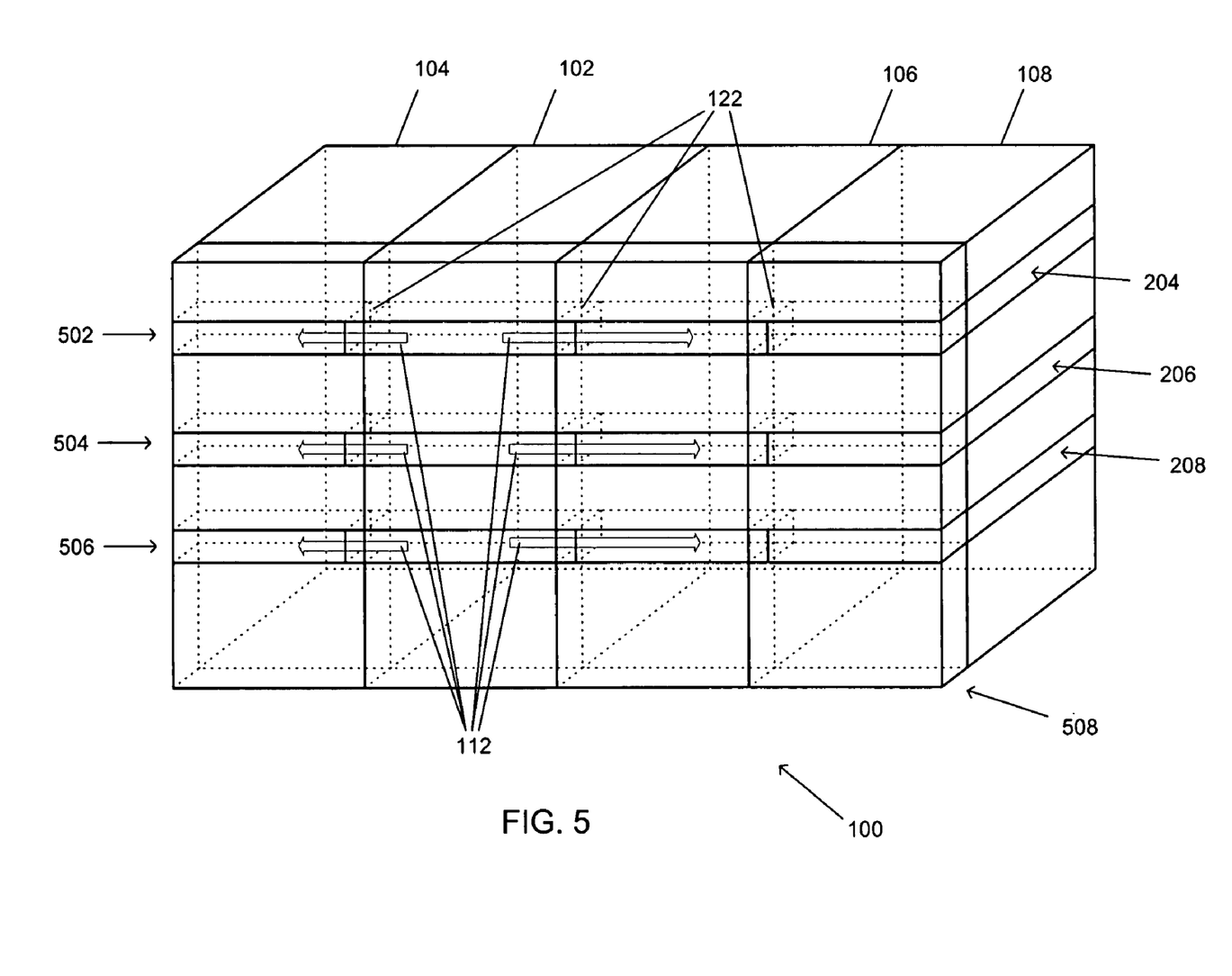
FIG. 5 is a representation of a perspective view of yet another implementation of the apparatus of FIG. 1 that comprises at least one enclosed duct.

Turning to FIG. 5, in another implementation of the apparatus 100, the intake duct 120 comprises at least one enclosed duct, for example, enclosed ducts 502, 504, and 506. In FIG. 5, the exhaust duct 120, exhaust airflow 114, electronic devices 110, sensors 128, and heat exchanger 116 are not shown for clarity. The enclosed ducts 502, 504, and 506 direct the intake airflow 112 to the equipment racks 104, 106, and 108. In alternative implementations, the exhaust duct 118 may also comprise at least one enclosed duct (not shown for clarity). If both the intake duct 120 and exhaust duct 118 comprise enclosed ducts, the intake duct 120, exhaust duct 118, cooling rack 102, and equipment racks 104, 106, and 108 form a substantially closed-loop for cooling of the equipment racks 104, 106, and 108. In one example, the enclosed ducts 502, 504, and 506 are configured to provide intake airflow 112 to the equipment shelves 204, 206, and 208, respectively. The cooling rack 102 and equipment racks 104, 106, and 108 in one example comprise a front door or panel, for example, front door 508. The front door 508 in one example supports the enclosed ducts 502, 504, and 506 to substantially seal the intake airflow 112. In a further example, the cooling rack 102 and equipment racks 104, 106, and 108 comprise cabinets with front, side, and rear doors to seal both the intake airflow 112 and exhaust airflow 114 to form a substantially closed-loop for cooling. The enclosed ducts 502, 504, and 506 in one example are removable to access the electronic devices 110 or the cooling rack 102.

Numerous alternative implementations of the present invention exist. The exhaust ducts 118 and 402, intake ducts 120 and 404, and vertical ducts 202 in one example are positioned in alternate orientations such as horizontally, vertically, or diagonally. The intake airflow 112 and 408 and exhaust airflow 114 and 406 in another implementation are routed in different directions within the cooling rack 102 or equipment racks 104, 106, or 108, such as front to back, back to front, top to bottom, or bottom to top, etc. The cooling rack 102 in one example comprises a plurality of heat exchangers 116; for example, one heat exchanger 116 per equipment shelf 502, 504, and 506.

The apparatus 100 in one example comprises a plurality of components such as one or more of electronic components, hardware components, and computer software components. A number of such components can be combined or divided in the apparatus 100. An example component of the apparatus 100, such as the control component 126, employs and/or comprises a set and/or series of computer instructions written in or implemented with any of a number of programming languages, as will be appreciated by those skilled in the art. The apparatus 100 in one example comprises any (e.g., horizontal, oblique, or vertical) orientation, with the description and figures herein illustrating one example orientation of the apparatus 100, for explanatory purposes.

The apparatus 100 in one example employs one or more computer-readable signal-bearing media. The computer-readable signal-bearing media store software, firmware and/or assembly language for performing one or more portions of one or more implementations of the invention. Examples of a computer-readable signal-bearing medium for the apparatus 100 comprise the recordable data storage medium 130 of the control component 126. The computer-readable signal-bearing medium for the apparatus 100 in one example comprise one or more of a magnetic, electrical, optical, biological, and atomic data storage medium. For example, the computer-readable signal-bearing medium comprise floppy disks, magnetic tapes, CD-ROMs, DVD-ROMs, hard disk drives, and electronic memory. In another example, the computer-readable signal-bearing medium comprises a modulated carrier signal transmitted over a network comprising or coupled with the apparatus 100, for instance, one or more of a telephone network, a local area network ("LAN"), a wide area network ("WAN"), the Internet, and a wireless network.

What is claimed is:

1. An apparatus, comprising:
   at least one heat exchanger mounted within a rack-mount equipment bay; and
   at least one duct coupled with the at least one heat exchanger that is configured to form a semi-closed cooling loop with at least one electronic device mounted within the rack-mount equipment bay, the at least one duct comprising an intake duct that directs an intake airflow from the at least one heat exchanger to an intake face of the at least one electronic device;
   wherein the intake duct comprises a primary delivery duct and at least one vertical duct coupled with the primary delivery duct;
   wherein the primary delivery duct directs the intake airflow substantially horizontally toward the at least one electronic device;
   wherein the at least one vertical duct directs the intake airflow substantially vertically from the primary delivery duct to the at least one electronic device; and
   wherein the primary delivery duct and the at least one vertical duct provide a cold air curtain to an intake face of the at least one electronic device;
   wherein the at least one duct directs an airflow between the at least one heat exchanger and the at least one electronic device for cooling of the at least one electronic device;
   wherein the rack-mount equipment bay comprises a plurality of rack locations, wherein the cooling rack is installable in each of the rack locations and wherein the equipment rack is installable in each of the rack locations, the cooling rack thereby being interchangeable with the equipment rack.

2. The apparatus of claim 1, further comprising a dedicated cooling rack within the rack-mount equipment bay;
   wherein the dedicated cooling rack comprises the at least one heat exchanger;
   wherein the at least one electronic device comprises a plurality of electronic devices mounted within a plurality of equipment racks of the rack-mount equipment bay;
   wherein the dedicated cooling rack cools the plurality of electronic devices.

3. The apparatus of claim 1, wherein the at least one duct is external to the at least one heat exchanger and the at least one electronic device.

4. The apparatus of claim 1, wherein the at least one duct comprises an exhaust duct that directs an exhaust airflow from an exhaust face of the at least one electronic device to the at least one heat exchanger.

5. The apparatus of claim 1, wherein the at least one duct comprises at least one damper that directs the airflow through the at least one duct.

6. The apparatus of claim 5 wherein the at least one damper comprises any of a static damper, a manually adjustable damper, and an automatically adjustable damper.

7. The apparatus of claim 1, wherein the at least one duct comprises at least one fan that directs airflow through the at least one duct.

8. The apparatus of claim 7, wherein the at least one fan comprises an adjustable fan.

9. The apparatus of claim 1, further comprising:
   a control component that monitors and controls cooling of the at least one electronic device.

10. The apparatus of claim 1, wherein the at least one duct comprises an intake duct and an exhaust duct;
    wherein the intake duct is coupled with the at least one best exchanger and an intake face of the at least one electronic device;
    wherein the exhaust duct is coupled with the at least one heat exchanger and an exhaust face of the at least one electronic device;
    wherein the at least one heat exchanger, the intake duct, the at least one electronic device, and the exhaust duct form a closed cooling loop.

11. The apparatus of claim 1, wherein the at least one beat exchanger comprises a refrigerant heat exchanger mounted within the rack-mount equipment bay.

12. An apparatus, comprising:
    a heat exchanger mounted within a rack-mount equipment bay that cools at least one electronic device mounted within the rack-mount equipment bay,
    an intake duct that directs an intake airflow from the heal exchanger to the at least one electronic device for cooling the at least one electronic device;
    an exhaust duct that directs an exhaust airflow from the at least one electronic device to the heat exchanger,
    a control component that monitors and adjusts the heat exchanger, the intake duct, and/or the exhaust duct through employment of at least one sensor for cooling of the at least one electronic device;
    wherein the heat exchanger cools the exhaust airflow and circulates the exhaust airflow back to the intake airflow;

wherein the intake duct, the heat exchanger, and the exhaust duct form a substantially semi-closed cooling loop;

wherein the intake duct comprises a primary delivery duct and at least one vertical duct coupled with the primary delivery duct, wherein the primary delivery duct directs the intake airflow substantially horizontally toward the at least one electronic device;

wherein the at least one vertical duct directs the intake airflow substantially vertically from the primary delivery duct to the at least one electronic device; and wherein the primary delivery duct and the at least one vertical duct provide a cold air curtain to an intake face of the at least one electronic device;

wherein the rack-mount equipment bay comprises a plurality of rack locations, wherein the cooling rack is installable in each of the rack locations and wherein the equipment rack is installable in each of the rack locations, the cooling rack thereby being interchangeable with the equipment rack.

13. The apparatus of claim 12, wherein the intake duct is coupled with the heat exchanger and the at least one electronic device;

wherein the exhaust duct is coupled with the heat exchanger and the at least one electronic device;

wherein the heat exchanger, the intake duct, the at least one electronic device, and the exhaust duct form a substantially closed cooling loop.

14. The apparatus of claim 12, wherein the at least one electronic device comprises a plurality of electronic devices mounted within a plurality of equipment shelves of the rack-mount equipment bay;

wherein the intake duct directs the intake airflow to the plurality of equipment shelves;

wherein the control component adjusts the intake airflow to the plurality of equipment shelves based on current cooling needs of the plurality of electronic devices.

15. The apparatus of claim 12, wherein the intake duct and the exhaust duct comprise one or more of an adjustable damper and an adjustable fan;

wherein the control component adjusts the airflow through the intake duct and the exhaust duct through employment of the adjustable damper and the adjustable fan.

16. The apparatus of claim 12, wherein the at least one sensor comprises any of a temperature sensor, airflow sensor, humidity sensor, or differential air pressure sensor.

17. A method, comprising the steps of:

positioning at least one heat exchanger within rack row spacing of a rack-mount equipment bay;

coupling at least one duct with the at least one heat exchanger to form a semi-closed cooling loop with at least one electronic device mounted within the rack-mount equipment bay, the at least one duct comprising an intake duct that directs an intake airflow from the at least one heat exchanger to an intake face of the at least one electronic device wherein the intake duct comprises a primary delivery duct and at least one vertical duct coupled with the primary delivery duct;

directing by the primary delivery duct the intake airflow substantially horizontally toward the at least one electronic device;

directing by the at least one vertical duct the intake airflow substantially vertically from the primary delivery duct to the at least one electronic device; and cooling the at least one electronic device through employment of the substantially vertical and substantially horizontal airflow to the at least one electronic device;

wherein the rack-mount equipment bay comprises a plurality of rack locations, wherein the cooling rack is installable in each of the rack locations and wherein the equipment rack is installable in each of the rack locations, the cooling rack thereby being interchangeable with the equipment rack.

18. The method of claim 17, wherein the step of coupling the at least one duct with the at least one heat exchanger comprises the step of:

coupling an exhaust duct with the at least one heat exchanger and the at least one electronic device;

wherein the step of directing the airflow between the at least one heat exchanger and the at least one electronic device comprises the step of:

receiving exhaust airflow from the at least one electronic device through the exhaust duct;

wherein the step of cooling the at least one electronic device through employment of the beat exchanger and the at least one duct comprises the step of:

cooling the exhaust airflow through employment of the heat exchanger.

19. The method of claim 17, wherein the step of coupling the at least one duct with the at least one heat exchanger comprises the step of:

coupling an intake duct with the at least one heat exchanger and the at least one electronic device;

wherein the step of directing the airflow between the at least one heat exchanger and the at least one electronic device comprises the step of:

directing the intake airflow to the at least one electronic device through the intake duct to cool the at least one electronic device.

20. The method of claim 19, wherein the step of coupling the at least one duct with the at least one heat exchanger comprises the step of;

coupling an exhaust duct with the at least one heat exchanger and the at least one electronic device;

wherein the step of directing the airflow between the at least one heat exchanger and the at least one electronic device comprises the steps of:

receiving exhaust airflow from the at least one electronic device through the exhaust duct; and circulating the exhaust airflow to intake airflow.

21. The method of claim 20, wherein the rack-mount equipment bay comprises a first equipment shelf and a second equipment shelf, wherein the at least one electronic device comprises a first electronic device mounted within the first equipment shelf and a second electronic device mounted within the second equipment shelf, the method further comprising the steps of:

determining a first amount of the intake airflow for the first equipment shelf based on current cooling needs of the first electronic device;

determining a second amount of the intake airflow for the second equipment shelf based on current cooling needs of the second electronic device, wherein the second amount is greater than the first amount;

diverting the first amount of the intake airflow to the first equipment shelf through employment of at least one of an adjustable damper and an adjustable fan;

diverting the second amount of the intake airflow to the second equipment shelf through employment of at least one of the adjustable damper and the adjustable fan.

22. The method of claim 17, further comprising the steps of:

monitoring the cooling of the at least one electronic device through employment of a control component and at least one sensor adjusting the cooling of the at least one electronic device, through employment of at least one of an adjustable damper and an adjustable fan, based on current cooling needs of the at least one electronic device.

* * * * *

UNITED STATES PATENT AND TRADEMARK OFFICE
CERTIFICATE OF CORRECTION

PATENT NO. : 7,447,022 B2
APPLICATION NO. : 11/501657
DATED : November 4, 2008
INVENTOR(S) : Vance Murakami et al.

Page 1 of 1

It is certified that error appears in the above-identified patent and that said Letters Patent is hereby corrected as shown below:

In column 8, line 41, in Claim 10, delete "best" and insert -- heat --, therefor.

In column 8, line 50, in Claim 11, delete "beat" and insert -- heat --, therefor.

In column 8, line 56, in Claim 12, delete "bay," and insert -- bay; --, therefor.

In column 8, line 57, in Claim 12, delete "heal" and. insert -- heat --, therefor.

In column 8, line 61, in Claim 12, delete "exchanger," and insert -- exchanger; --, therefor.

In column 9, line 6, in Claim 12, delete "duct," and insert -- duct; --, therefor.

In column 10, line 22, in Claim 18, delete "beat" and insert -- heat --, therefor.

In column 10, line 40, in Claim 20, delete "of;" and insert -- of: --, therefor.

In column 11, line 8, in Claim 22, after "sensor" insert -- ; --.

Signed and Sealed this

Twenty-fourth Day of November, 2009

David J. Kappos
*Director of the United States Patent and Trademark Office*